United States Patent [19]

Tanaka

[11] Patent Number: 4,728,929
[45] Date of Patent: Mar. 1, 1988

[54] METHOD AND APPARATUS FOR ENCODING BINARY DATA

[75] Inventor: Shinichi Tanaka, Kyoto, Japan

[73] Assignee: Matsushita Electric Industrial Co., Ltd., Osaka, Japan

[21] Appl. No.: 782,304

[22] Filed: Oct. 1, 1985

[30] Foreign Application Priority Data

Oct. 1, 1984 [JP] Japan .................... 59-205804
Oct. 18, 1984 [JP] Japan .................... 59-219714

[51] Int. Cl.$^4$ .................................................. H03M 5/12
[52] U.S. Cl. ................................................. 340/347 DD
[58] Field of Search ............. 340/347 DD; 360/39–41

[56] References Cited

U.S. PATENT DOCUMENTS

| | | | |
|---|---|---|---|
| 3,689,899 | 9/1972 | Franaszek | 340/347 DD |
| 4,323,931 | 4/1982 | Jacoby | 360/40 |
| 4,358,852 | 11/1982 | Ichikawa et al. | 360/40 X |
| 4,387,364 | 6/1983 | Shirota | 360/40 X |
| 4,456,905 | 6/1984 | Odaka | 360/40 X |
| 4,496,934 | 1/1985 | Furukawa | 360/40 X |
| 4,502,036 | 2/1985 | Furukawa | 360/40 X |
| 4,520,346 | 5/1985 | Shimada | 360/40 X |
| 4,544,962 | 10/1985 | Kato et al. | 360/40 |
| 4,546,393 | 10/1985 | Mori et al. | 360/40 |

OTHER PUBLICATIONS

IEEE Transactions on Magnetics, vol. MAG–13, No. 5, Sep. 1977, "A New Look-Ahead Code for Increased Data Density", George V. Jacoby, Senior Member IEEE.

Error-Correcting Codes, Second Edition, By W. Wesley Peterson et al., pp. 182–189, 204, 205.

Primary Examiner—T. J. Sloyan
Attorney, Agent, or Firm—Wenderoth, Lind & Ponack

[57] ABSTRACT

A method and apparatus for encoding binary data in which the method includes the steps of converting data words each containing N data bits to channel words each containing M data bits, and producing NRZI code data from the channel words. In the converting step, a data word is not converted in real time when the data word has a specific data bit pattern or when the data word is in a specific relationship to adjacent data words. This unconverted data word is converted to an established channel word which is so determined to reduce the DSV at a time when a predetermined number of data words which are convertible in real time have been inputted or when another data word which should be maintained unconverted has been inputted again. The established channel word is outputted after at least a delay time which is required to convert the unconverted data word to the established channel word.

11 Claims, 16 Drawing Figures

FIG. 2

4/8 CONVERSION TABLE

| DATA WORD | | | | CHANNEL WORD | | | | | | | |
|---|---|---|---|---|---|---|---|---|---|---|---|
| $a_3$ | $a_2$ | $a_1$ | $a_0$ | $b_7$ | $b_6$ | $b_5$ | $b_4$ | $b_3$ | $b_2$ | $b_1$ | $b_0$ |
| 0 | 0 | 0 | 0 | 0 | 0 | 0 | * | 0 | 0 | 0 | 0 |
| 0 | 0 | 0 | 1 | 0 | 0 | 0 | * | 0 | 0 | 1 | 0 |
| 0 | 0 | 1 | 0 | 0 | 0 | 0 | 0 | 0 | 1 | 0 | 0 |
| 0 | 0 | 1 | 1 | 0 | 0 | 0 | 0 | 1 | 0 | 0 | 0 |
| 0 | 1 | 0 | 0 | 0 | 0 | 1 | 0 | 0 | 0 | 0 | 0 |
| 0 | 1 | 0 | 1 | 0 | 0 | 1 | 0 | 0 | 0 | 1 | 0 |
| 0 | 1 | 1 | 0 | 0 | 0 | 1 | 0 | 0 | 1 | 0 | 0 |
| 0 | 1 | 1 | 1 | 1 | 0 | 0 | 1 | 0 | 0 | 1 | 0 |
| 1 | 0 | 0 | 0 | 0 | 1 | 0 | 0 | 0 | 0 | 0 | 0 |
| 1 | 0 | 0 | 1 | 0 | 1 | 0 | 0 | 0 | 0 | 1 | 0 |
| 1 | 0 | 1 | 0 | 0 | 1 | 0 | 0 | 0 | 1 | 0 | 0 |
| 1 | 0 | 1 | 1 | 0 | 1 | 0 | 0 | 1 | 0 | 0 | 0 |
| 1 | 1 | 0 | 0 | 1 | 0 | 0 | * | 0 | 0 | 0 | 0 |
| 1 | 1 | 0 | 1 | 1 | 0 | 0 | 0 | 0 | 0 | 1 | 0 |
| 1 | 1 | 1 | 0 | 1 | 0 | 0 | 0 | 0 | 1 | 0 | 0 |
| 1 | 1 | 1 | 1 | 1 | 0 | 0 | 0 | 1 | 0 | 0 | 0 |

NOTE: '*' IS '0' OR '1'

FIG. 6

4/8 CONVERSION TABLE

| DATA WORD | | | | CHANNEL WORD | | | | | | | |
|---|---|---|---|---|---|---|---|---|---|---|---|
| $a_3$ | $a_2$ | $a_1$ | $a_0$ | $b_7$ | $b_6$ | $b_5$ | $b_4$ | $b_3$ | $b_2$ | $b_1$ | $b_0$ |
| 0 | 0 | 0 | 0 | 0 | 0 | 0 | * | 0 | 0 | 0 | 0 |
| 0 | 0 | 0 | 1 | 0 | 0 | 0 | * | 0 | 0 | 1 | 0 |
| 0 | 0 | 1 | 0 | 0 | 0 | 0 | 0 | 0 | 1 | 0 | 0 |
| 0 | 0 | 1 | 1 | 1 | 0 | 0 | 1 | 0 | 0 | 1 | 0 |
| 0 | 1 | 0 | 0 | 0 | 0 | 0 | 0 | 1 | 0 | 0 | 0 |
| 0 | 1 | 0 | 1 | 0 | 0 | 1 | 0 | 0 | 1 | 0 | 0 |
| 0 | 1 | 1 | 0 | 0 | 0 | 1 | 0 | 0 | 0 | 1 | 0 |
| 0 | 1 | 1 | 1 | 0 | 0 | 1 | 0 | 0 | 0 | 0 | 0 |
| 1 | 0 | 0 | 0 | 1 | 0 | 0 | * | 0 | 0 | 0 | 0 |
| 1 | 0 | 0 | 1 | 1 | 0 | 0 | 0 | 0 | 0 | 1 | 0 |
| 1 | 0 | 1 | 0 | 1 | 0 | 0 | 0 | 0 | 1 | 0 | 0 |
| 1 | 0 | 1 | 1 | 0 | 1 | 0 | 0 | 1 | 0 | 0 | 0 |
| 1 | 1 | 0 | 0 | 1 | 0 | 0 | 0 | 1 | 0 | 0 | 0 |
| 1 | 1 | 0 | 1 | 0 | 1 | 0 | 0 | 0 | 1 | 0 | 0 |
| 1 | 1 | 1 | 0 | 0 | 1 | 0 | 0 | 0 | 0 | 1 | 0 |
| 1 | 1 | 1 | 1 | 0 | 1 | 0 | 0 | 0 | 0 | 0 | 0 |

NOTE: '*' IS '0' OR '1'

TEMPORARY INVERSE-CONVERSION TABLE

| CHANNEL WORD | | | DATA WORD | | | |
|---|---|---|---|---|---|---|
| $b_7$ | $b_6$ | $b_5$ | $a_3$ | $a_2$ | $a_1$ | $a_0$ |
| 0 | 0 | 0 | 0 | 0 | 0 | 0 |
| 0 | 0 | 1 | 0 | 1 | 1 | 1 |
| 0 | 1 | 0 | 1 | 1 | 1 | 1 |
| 1 | 0 | 0 | 1 | 0 | 0 | 0 |

2/4 CONVERSION TABLE

| DATA WORD | | CHANNEL WORD | | | |
|---|---|---|---|---|---|
| $a_1$ | $a_0$ | $b_3$ | $b_2$ | $b_1$ | $b_0$ |
| 0 | 0 | 1 | 0 | * | 0 |
| 0 | 1 | 0 | 0 | 0 | 0 |
| 1 | 0 | 0 | 0 | 1 | 0 |
| 1 | 1 | 0 | 1 | 0 | 0 |

NOTE: '*' IS '0' OR '1'

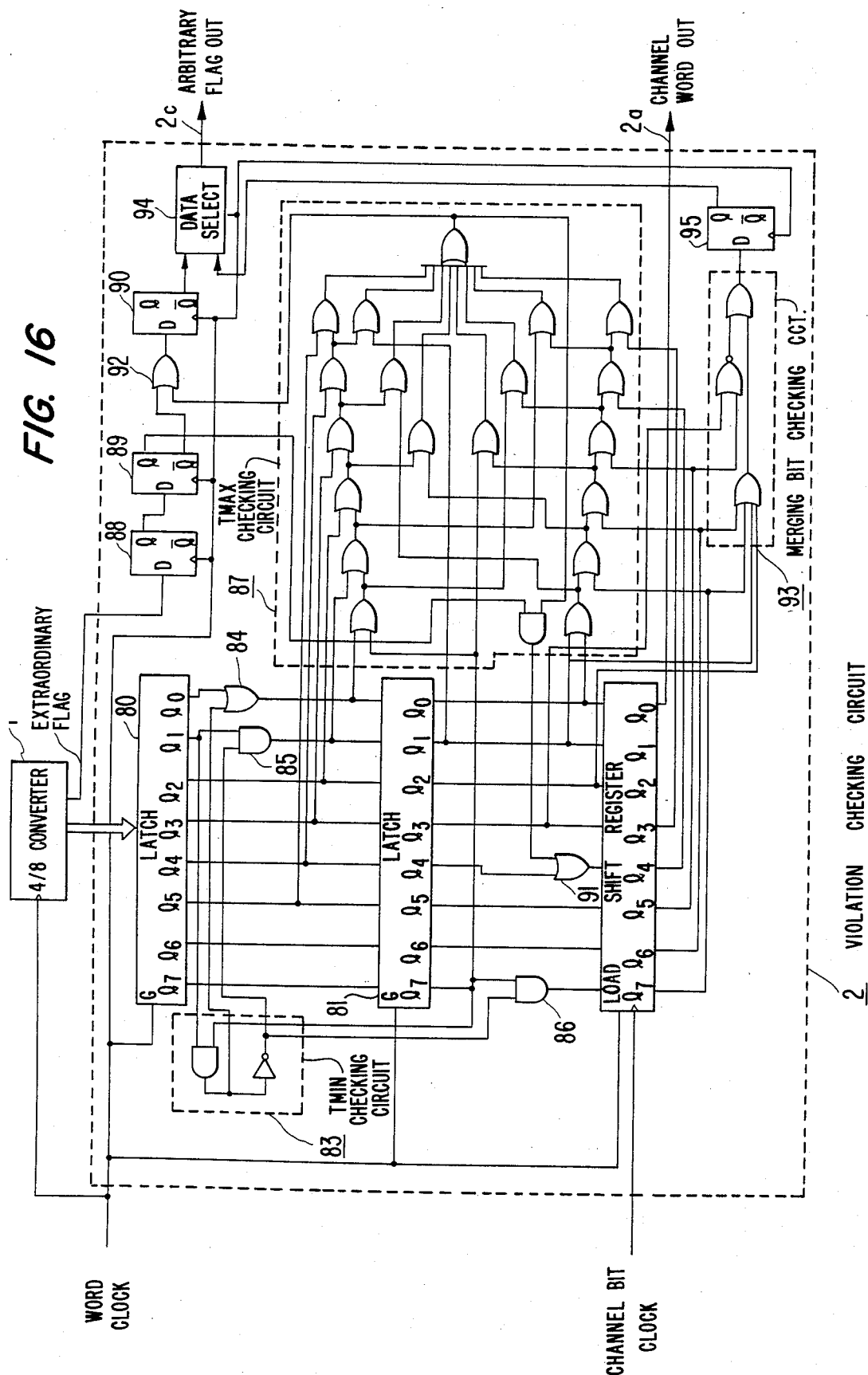

METHOD AND APPARATUS FOR ENCODING BINARY DATA

BACKGROUND OF THE INVENTION

1. Field of the Invention

This invention relates generally to the digital data processing art and more particularly to a new method and apparatus for encoding binary digital data which is particularly suitable to be used in digital data communication systems and digital data storage and retrieval systems.

2. Description of the Prior Art

Data storage capacity of digital data storage and retrieval systems has been gradually increasing, and some improved methods for encoding binary digital data have contributed to the increase of storage data capacity to a large extent. Generally, the method for encoding binary data is required to have the following features:

(i) a large value of $T_{min}$;
(ii) a small value of $T_{max}$; and
(iii) is DC free, where $T_{min}$ and $T_{max}$ represent respectively the minimum and maximum distances between encoded signal transitions. The feature (i) means that the high frequency spectra of the encoded digital signals is reduced. With this feature, the upper limit of the transmission band can be lowered, or storage capacity of the data storage system can be increased. The feature (ii) means that self clocking is possible. With this feature, the timing shift between the clock and signals is reduced, so that the storage capacity of the data storage system can be increased. As a method which is excellent in the features (i) and (ii), the so-called "3PM" method is already known as disclosed in U.S. Pat. No. 4,323,931. This method separates input binary data into successive data words each containing 3 data bits and converts each data word to a channel word containing 6 data bits. The 3PM method has such excellent features of $T_{min}=1.5T$ and $T_{max}=6T$, but does not have the feature (iii).

In the case of retrieving data from a magnetic storage medium by means of a ring head in which differential signals can be detected, it is possible to detect peak levels of the retrieved signals, so that it is not necessary to be DC free. However, when the retrieved signals contain a large amount of noise, the differential signals must be integrated prior to being wave-formed. In this case, a DC free encoding method is desirable. Also, in the case of using a thin-film head having a magnetoresistance effect in which the differential signals are not retrieved, a DC free encoding method is desired. Moreover, in optical data storage and retrieval systems which require accurate tracking on data tracks, encoded digital signals will be added as noise to the tracking control signal if the encoding method is not DC free.

As a method having all of the above features (i), (ii) and (iii), the so-called "EFM" method is already known which is applied to the "compact disk" (trademark of Philips Corp. and Sony Corp.). This method realizes a very small value of digital sum variations (DSV, hereafter), where DSV is generally defined as a value obtained by summing data bits of encoded binary data assuming bit '1' as $-1$ and bit '0' as $+1$. The EFM method separate input binary data into data words each containing 8 data bits, converts each data word to a channel word containing 14 data bits, inserts 3 merging bits between two channel words, and converts the obtained data to NRZI code data. The merging bits are selected, by referring to the previous DSV and the following channel word, so as to reduce the total DSV, so as to thereby make the encoded data DC free. In this method, however, a complicated decoding circuit must be provided for decoding the 14-bit channel words. If the number of data bits of the channel word is reduced for simplifying the decoding circuit, then the data storage capacity is decreases due to the overhead of the 3 merging bits.

SUMMARY OF THE INVENTION

An object of the present invention is to provide a method and an apparatus for encoding binary data using a method for encoding binary data which has the features of being DC free and a large minimum distance between encoded signal transitions and does not require a complicated decoding circuit.

In order to achieve this object, the apparatus for encoding binary data according to the present invention comprises: a converting means for separating input binary data into data words each containing N data bits (wherein N is an integer larger than (1) and converting each of the data words to a channel word containing M data bits (wherein M is an integer large than (N); and an encoding means for producing NRZI code data from said channel word. The converting means does not convert a data word when the data word has a specific data bit pattern or when the data word is in a specific relationship to adjacent data words. This unconverted data word is converted to an established channel word which is so determined to reduce the DSV at a time when a predetermined number of data words which are convertible in real time have been inputted or when another data word which should be maintained unconverted has been inputted again. Further, the converting means outputs a channel word after at least a delay time which is required to convert the unconverted data word to the established channel word.

The conversion may preferably be performed according to the following rules:

(i) two or more '0' bits exist between two '1' bits in the channel word if the channel word contain two or more '1' bits;

(ii) a most significant bit or least significant bit of each channel word is made normally '0' as a merging bit, and when bits adjacent to said merging bit at both sides thereof are both '1', the adjacent bits are both made '0' and the merging bit is made '1'; and (iii) the merging bit is made '0' or '1' so that the absolute value of the DSV is reduced when a bit which is three bits before the merging bit is '1' and the merging bit is followed by two continuous '0' bits or when two continuous bits just before the merging bit are both '0' and a bit three bits after the merging bit is '1'.

Or, the conversion may preferably be performed according to the following rules:

(i) two or more '0' bits exist between two '1' bits in the channel word if the channel word contains two or more '1' bits;

(ii) a most significant bit or least significant bit of each channel word is made normally '0' as a merging bit, and when bits adjacent to the merging bit at both sides thereof are both '1', the adjacent bits are both made '0' and the merging bit is made '1';

(iii) the merging bit is made '0' or '1' so that the absolute value of the DSV is reduced when a bit which is three bits before the merging bit is '1' and two bits following the merging bit are both '0' or when two bits just before the merging biyt are both '0' and a bit three bits after the merging bit is '1'; and (iv) the specific data word is converted to one of two channel words which differ from each other only in one specific data bit so that the absolute value of DSV is reduced.

With the above configuration, even if the number of operations for suppressing the DSV is small, the DSV can be effectively suppressed. Accordingly, the DC free feature can be obtained without largely sacrificing the above features (i) and (ii). Also, the above features (i), (ii) and (iii) can be obtained even if the number of bits of the channel word is small and a conversion rule which requires an easy inverse-conversion is used.

The above and other objects, features and advantages of the present invention will become apparent from the following description taken in connection with the accompanying drawings in which:

BRIEF DESCRIPTION OF THE DRAWINGS

FIG. 2 is a conversion table for a 4/8 converter used in the FIG. 1 embodiment;

FIG. 6 is another conversion table for a 4/8 converter used in the FIG. 1 or FIG. 2 embodiment;

FIG. 16 is a circuit diagram showing an example of a violation checking circuit used in this invention.

DESCRIPTION OF THE PREFERRED EMBODIMENTS

Figure 1:
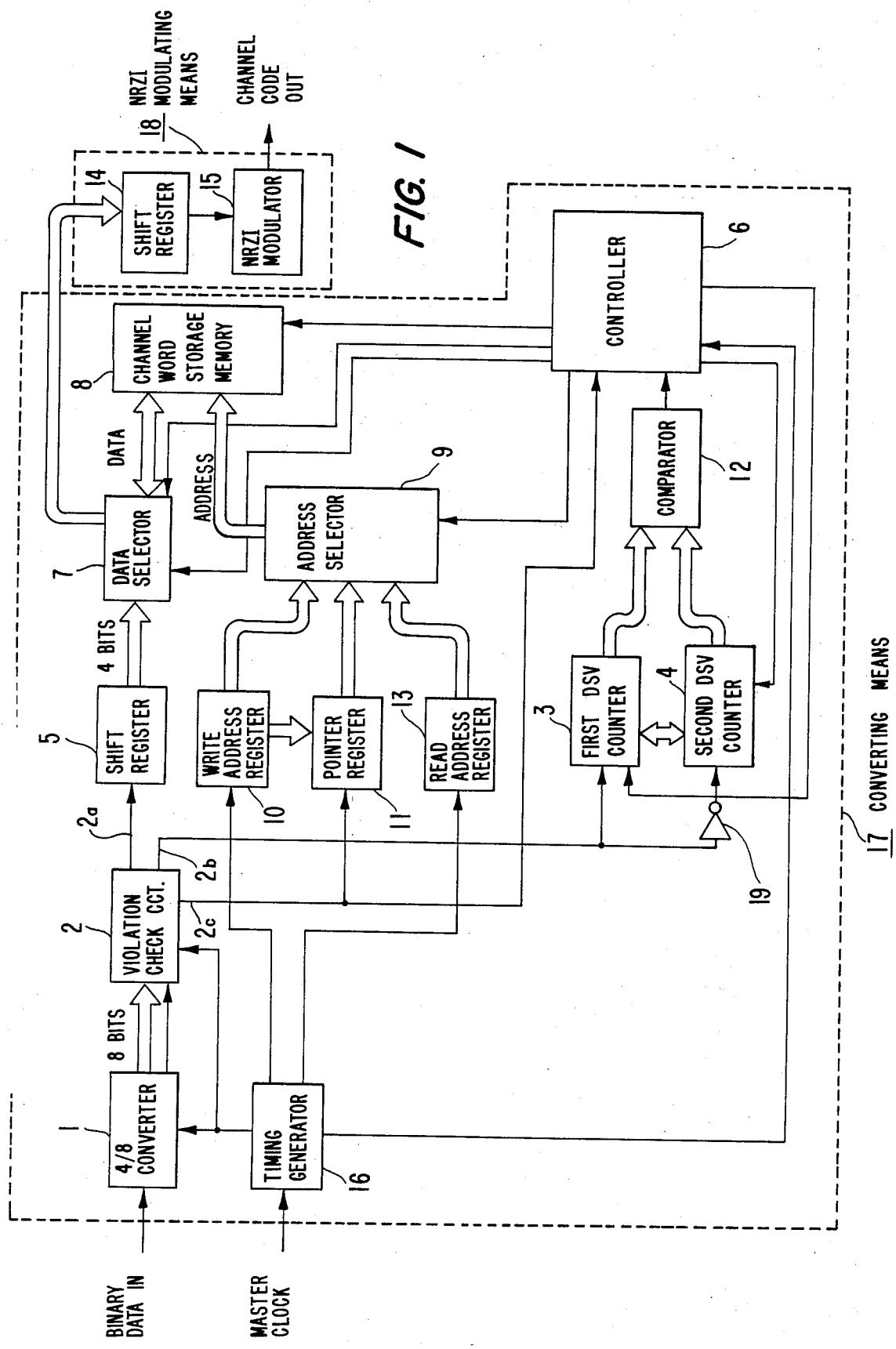
FIG. 1 is a block diagram of an embodiment according to the present invention.

Referring to FIG. 1, a 4/8 converter 1 converts a data word containing 4 input data bits to a channel word containing 8 data bits according to the following conversion rules:

rule 1: Convert a 4-bit data word to a 8-bit channel word.

rule 2: If a data word contains a plurality of '1' bits, more than one '0' bits exist between the '1' bits.

rule 3: Either of the most and least significant bits of each channel word is made '0' as a merging bit.

There exist 19 kinds of channel words which satisfy all of the above three rules. There exist many conversion tables on which the 19 kinds of channel words correspond to 16 kinds of data words. One preferred example of such conversion tables is shown in FIG. 2. Each data word consists of 4 data bits—$a_3$, $a_2$, $a_1$ and $a_0$—in the order from the most significant bit (MSB) to the least significant bit (LSB), and each channel word consists of 8 data bits—$b_7$, $b_6$, $b_5$, $b_4$, $b_3$, $b_2$, $b_1$ and $b_0$—in the order from the MSB to the LSB. In this conversion table, each of three kinds of data words 0000, 0001 and 1100 corresponds to two kinds of channel words. We call these three kinds of data words "extraordinary data words" and the other data words "ordinary data words". Each extraordinary data word correspond to two kinds of channel words: one in which bit $b_4$ indicated by * is '0' and the other in which bit $b_4$ indicated by * is '1'. We call this bit $b_4$ an "extraordinary bit". Bit $b_0$ is a merging bit for connecting channel words.

The 4/8 converter 1, when converts the extraordinary data word, temporarily makes the extraordinary bit '0' and sets an extraordinary flag. A violation checking circuit 2 converts each channel word to serial data starting from bit $b_0$ and tests whether the number of continuous '0' bits between two '1' bits is between 2 and 11. Since the conversion table in FIG. 2 is made such that two '0' bits exist between two '1' bits in each channel word, the case in which the number of '0' bits between two '1' bits becomes one or zero occurs only when the bits adjacent to the merging bit $b_0$ at both sides thereof are both '1'. In this particular case, the violation checking circuit 2 makes the merging bit $b_0$ '1' and both of the bits adjacent to the merging bit $b_0$ at both side thereof '0', so that the number of '0' bits between two '1' bits is always more than one. Since the merging bit $b_0$ is always zero except the above particular case, inverse-conversion of encoded data during decoding can be performed in such a manner that when the merging bit $b_0$ is '0', the encoded data is inverse-converted according to the conversion table, and when the merging bit $b_0$ is '1', the merging bit $b_0$ is changed to '0' and both of the bits adjacent to the merging bit $b_0$ on both sides thereof are changed to '1'.

Furthermore, according to the conversion table in FIG. 2, when all of the extraordinary bits in the extraordinary data words are '1', the number of continuous '0' bits between two '1' bits is less than 12 regardless of the connection of the channel words. Accordingly, the violation checking circuit 2 will make the extraordinary bit '1' when it detects 12 or more continuous '0' bits between two '1' bits.

By performing the violation check as described above, the features of $T_{min}=1.5T$ and $T_{max}=6T$ can be obtained. The violation checking circuit 2 outputs from an output terminal 2a first the lower 4 bits and then the upper 4 bits of each channel word separately, each 4 bits of data being serial order from the LSB to the MSB. When the upper 4 bits $b_4$, $b_5$, $b_6$ and $b_7$ are outputted, the extraordinary flag is set with respect to the channel word, and if the extraordinary bit $b_4$ is '0', an arbitrary flag 2c is set and outputted from an output terminal 2c. When the lower 4 bits $b_0$, $b_1$, $b_2$ and $b_3$ are outputted, the arbitrary flag 2c is set when bit $b_5$ of the preceeding channel word is '1' and bits $b_1$ and $b_2$ following the merging bit $b_0$ are both '0' or when bits $b_6$ and $b_7$ of the preceeding channel word are both '0' and bit $b_3$ following the merging bit $b_0$ is '1'. In these cases, the situation will never occur wherein both bits $b_7$ and $b_1$ on both sides of the merging bit $b_0$ become '1' and even if the merging bit $b_0$ is made '1', the number of '0' bits between two '1' bits will never become less than two. Accordingly, the above cases can be discriminated from the case wherein the merging bit $b_0$ was made '1' by the violation check.

As described above, bits $b_0$ and $b_4$ of the channel word outputted from the output terminal 2a are always '0' when the arbitrary flag 2c is set. From an output terminal 2b of the violation checking circuit 2 is outputted a temporary channel code of NRZI code. A first DSV counter 3 counts the DSV of the temporary channel code, and a second DSV counter 4 counts the DSV of an inverted channel code which is obtained by inverting the temporary channel code with an inverter 19. A comparator 12 compares the absolute values of the DSV obtained by the first and second DSV counters 3 and 4.

A shift register 5 converts each of the serial upper 4 bits and lower 4 bits of the channel word outputted from the output terminal 2a of the violation checking circuit 2 to parallel 4-bit data (half word, hereafter). A controller 6 controls a data selector 7 to apply the half word outputted from the shift register 5 to a data input port of a channel word storage memory 8, and at the same time controls an address selector 9 to apply a write address outputted from a write address counter 10 to an address input port of the channel word storage memory 8, so that the half word is written into the channel word storage memory 8. The write address counter 10 is incremented when the above writing operation is completed. When the arbitrary flag 2c is set, the output address of the write address counter 10 is stored into a pointer register 11 before the write address counter 10 is incremented. The above operation is repeated so as to thereby store half words in the channel word storage memory 8.

Among the half words stored in the channel word storage memory 8, the half word stored in the address stored in the pointer register 11 is a temporary half word in which the extraordinary bit $b_4$ or the merging bit $b_0$ is '0'. The extraordinary bit $b_4$ or the merging bit $b_0$ may be made '1'. The value of bit $b_4$ or bit $b_0$ will be determined later in the following manner.

When the arbitrary flag 2c is set again by the violation checking circuit 2, the controller 6 refers to the comparison result of the comparator 12. If the absolute value of the DSV outputted from the second DSV counter 4 is smaller than that outputted from the first DSV counter 3, the controller 6 controls the data selector 7 and the address selector 9 to write '1' into bit $b_0$ or bit $b_4$ of the half word stored in the channel word storage memory 8 in the address indicated by the address data stored in the pointer register 11. Oppositely, if the absolute value of the DSV outputted from the first DSV counter 3 is smaller than that from the second DSV counter 4, bit $b_0$ or bit $b_4$ of the half word stored in the channel word storage memory 8 in the address indicated by the address data stored in the pointer register 11 remains unchanged or has a '0' written therein again. In this manner, the value of the temporary half word is established. At this time, the controller 6 loads the DSV having the larger absolute value from one of the first and second DSV counters to the other.

When a predetermined number of half words are stored in the channel word storage memory 8 the controller 6 controls the data selector 7 and the address selector 9 to read out from the memory 8 the half word stored in the address indicated by the address data outputted from a read address counter 13. The read-out half words are each converted to serial data by a shift register 14. A NRZI modulator 15 modulates each of the serial half words outputted from the shift register 14 into a NRZI code data as a finally obtained channel code.

When a temporary half word has been written into the channel word storage memory 8 and no other temporary half word has been written, or the arbitrary flag 2c has not been set, until the predetermined number of half words is written into the memory 8, the temporary half word would be read out as is. In order to eliminate this problem, the controller 6 changes the temporary half word in the memory 8 to a half word having an established content in accordance with the comparison result of the comparator 12 at the moment before the half word is read out from the memory 8.

Timing signals such as bit clocks and word clocks necessary for the elements configuring the above embodiment are produced from a master clock signal by a timing generator 16. In the above embodiment, 4/8 converter 1, violation checking circuit 2, first and second DSV counters 3 and 4, shift register 5, controller 6, data selector 7, channel word storage memory 8, address selector 9, write and read address counters 10 and 13, pointer register 11, comparator 12 and timing generator 16 constitute a converting means 1; and shift register 14 and NRZI modulator 15 constitute a NRZI modulating means 18.

In the above embodiment, each channel word is divided into two half words and the half words are stored in the channel word storage memory 8. However, each channel word may be stored as is in the memory 8 without being divided. In this case, the address where a temporary channel word is stored may be stored in the pointer register 11 and an information showing an arbitrary bit should be stored in a memory. Furthermore, instead of storing the channel words in the channel word storage memory, the data words may be stored in a data word storage memory. Furthermore, the first and second DSV counters 3 and 4 may be replaced by a single DSV counter for counting the DSV of channel words and an accumulator for accumulating the output values of the DSV counter. Another embodiment modified in this way is shown in FIG. 3.

Figure 3:
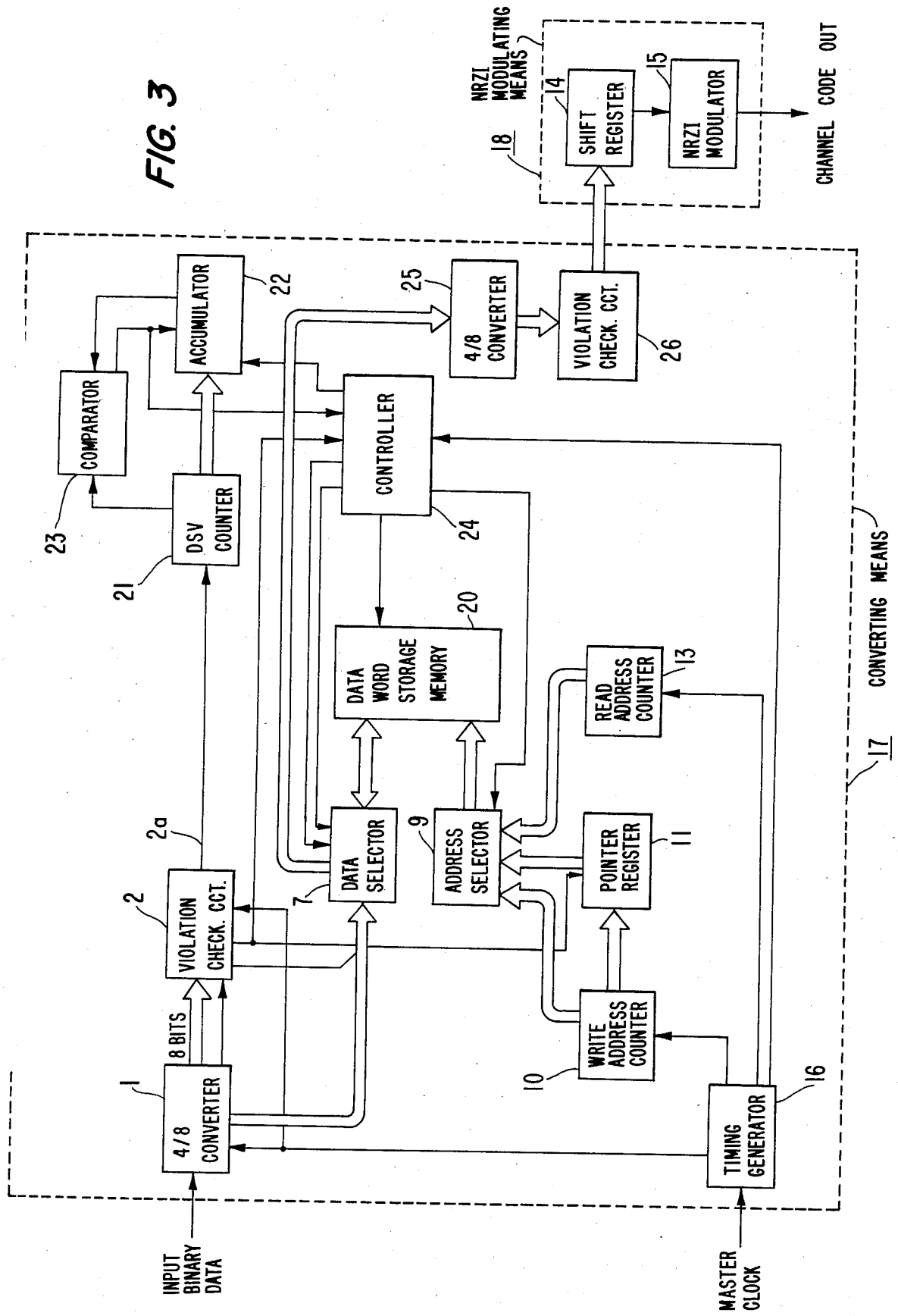
FIG. 3 is a block diagram of another embodiment according to the present invention.

Referring to FIG. 3, a controller 24 controls the data selector 7 and the address selector 9 to write data words into a data word storage memory 20 according to the addresses outputted from the write address counter 10. If the data word to be written into the memory 20 is an extraordinary data word, the 4/8 converter 1 sets an extraordinary flag. The violation checking circuit 2 refers to the extraordinary flag and performs a violation check. That is, if the extraordinary bit or the merging bit is selectable so as to reduce the DSV, the violation checking circuit 2 sets the arbitrary flag and outputs it from the output terminal 2c. If both the extraordinary bit and the merging bit are selectable, either one of them may be selected by fixing the other so as to be '0' or '1'. This is advantageous in that it is not necessary to provide two kinds of arbitrary flags corresponding to the extraordinary and merging bits.

When the arbitrary flag is set, an accumulator 22 stores the value of the DSV at this moment and a DSV counter 21 is cleared. At the same time, the address in which the data word corresponding to the arbitrary flag is written is stored in the pointer register 11. The violation checking circuit 2 outputs from the output terminal 2a a temporary channel word containing the selectable bit which is arbitrarily made '0'. After that, the DSV counter 21 counts the DSV of the channel words outputted from the violation checking circuit 2. A comparator 23 compares the sign of the DSV count output from the DSV counter 21 with the sign of the DSV stored in the accumulator 22.

Under this condition, when an extraordinary data word, which cannot be converted in real time, is inputted again, the arbitrary flag is set again. When the arbitrary flag is set again, a controller 24, referring to the comparison result of the comparator 23, will make '0' the bit corresponding to the attribute contained in the data word stored in the address in the data word storage memory 20 indicated by the address stored in the pointer register 11 when the signs of the DSV are equal to each other, and will make '1' the same bit when the signs are different from each other. Furthermore, the controller 24 controls the accumulator 22 to subtract the output value of the DSV counter 21 from the value stored in the accumulator 22 when the comparator 23 shows the signs of the both values are equal to ach other, and to add the output valve of the DSV counter 21 to the value stored in the accumulator 22 when the comparator 23 shows the signs of the both values are different from each other. Then, the DSV counter 21 is cleared and the above operation will be repeated.

The controller 24 controls the data selector 7 and the address selector 9 to read out the data words stored in the data word storage memory 20 with a delay time necessary for the temporary channel word to be establish. The read-out data words are converted to channel words by a secondary 4/8 converter 25. Each channel word outputted from the secondary 4/8 converter 25 is subjected to violation check by a secondary violation checking circuit 26. The secondary 4/8 converter 25, when converting an extraordinary data word, makes the value of the extraordinary bit the same as the value of the attribute. The channel words subjected to the violation check are then applied to the NRZI modulating means 18 where they are modulated into NRZI coded channel codes. In the above way the absolute value of the DSV of the channel codes are controlled so as to be small. In this embodiment, controller 24, data and address selectors 7 and 9, secondary 4/8 converter 25 and secondary violation checking circuit 26 constitute a read-out means.

The conversion table in FIG. 2, used for the conversion at the 4/8 converter 1 in the above two embodiments, will further be described in more detail. This conversion table is made such that the conversion and inverse-conversion between the data words and the channel words are easy. That is, except for the data word 0111, there exist fixed relationships between the upper two bits ($a_3$, $a_2$) of the data words and the upper three bits ($b_7$, $b_6$, $b_5$) of the channel words and between the lower two bits ($a_1$, $a_0$) of the data words and the lower three bits ($b_2$, $b_1$, $b_0$) of the channel words, as follows:

| data words | | | channel words | | |
|---|---|---|---|---|---|
| $a_3$ | $a_2$ | $\longleftrightarrow$ | $b_7$ | $b_6$ | $b_5$ |
| $a_1$ | $a_0$ | $\longleftrightarrow$ | $b_2$ | $b_1$ | $b_0$ |
| 0 | 0 | $\longleftrightarrow$ | 0 | 0 | 0 |
| 0 | 1 | $\longleftrightarrow$ | 0 | 0 | 1 |
| 1 | 0 | $\longleftrightarrow$ | 0 | 1 | 0 |
| 1 | 1 | $\longleftrightarrow$ | 1 | 0 | 0 |

This simple relationship between the data words and the channel words is advantageous in that the conversion and inverse-conversion between the words can be achieved by a simple logical circuit configuration.

Figure 4:
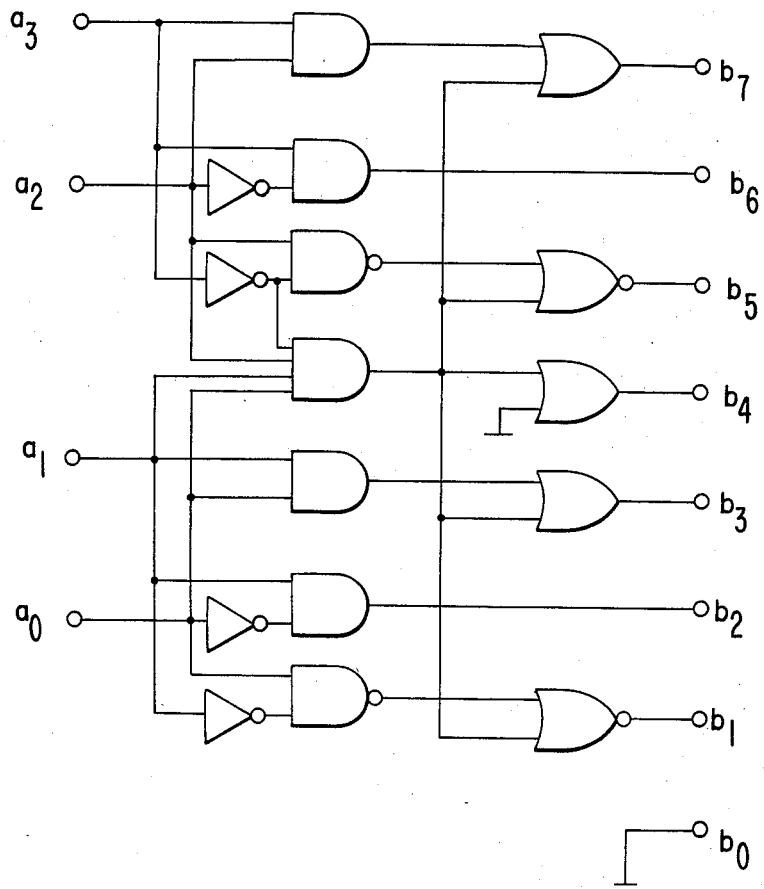
FIG. 4 is a logic circuit diagram of an embodiment of a circuit for performing conversion according to the conversion table in FIG. 2.
Figure 5:
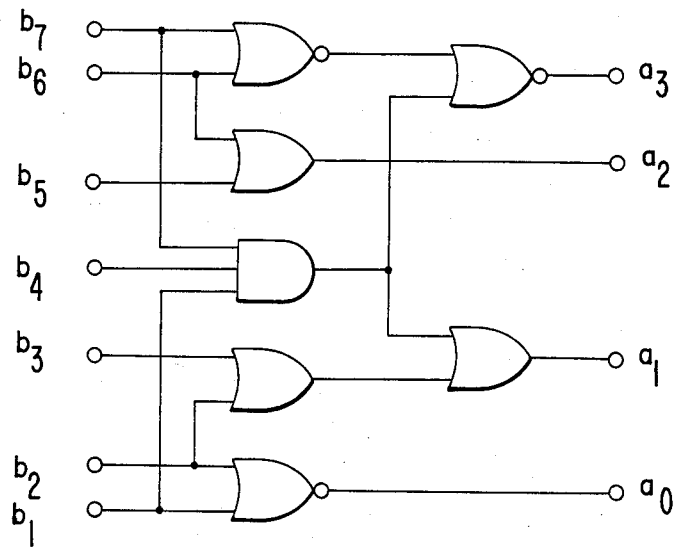
FIG. 5 is a logic circuit diagram of an embodiment of a circuit for performing inverse-conversion according to the conversion table in FIG. 2.

FIG. 4 shows an example of the 4/8 converter for converting the 4-bit data words to the 8-bit channel words according to the conversion table in FIG. 2. In the configuration of FIG. 4, bit $b_0$ is always '0'. The value of bit $b_0$ is determined later by the violation checking circuit so as to properly connect channel words. FIG. 5 shows an example of a 8/4 converter for inversely converting the 8-bit channel words to the 4-bit data words according to the conversion table in FIG. 2 in a decoding system.

In addition to the above advantage, the conversion table in FIG. 2 provides a large $T_{min}$ ($T_{min}=1.5T$) and a DC free feature.

Figures 7, 8, 9:
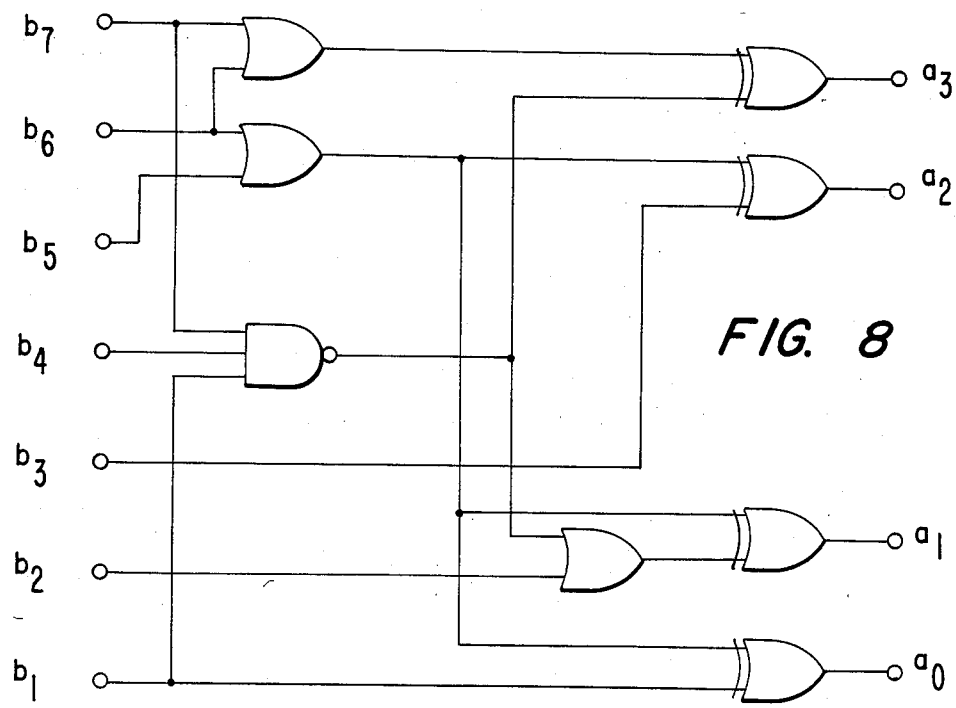
FIG. 7 is a temporary inverse-conversion table for a temporary inverse-conversion performed as a first step prior to the inverse-conversion according to the conversion table in FIG. 6.
FIG. 8 is a logic circuit diagram of an embodiment of a circuit for performing inverse-conversion according to the conversion table in FIG. 6.
FIG. 9 is a conversion table for a 2/4 converter used in place of the 4/8 converter in the FIG. 1 or FIG. 3 embodiment.

Another 4/8 conversion table is shown in FIG. 6 in which, with respect to each of three data words 0000, 0001 and 1000, two channel words are selectable one in which bit $b_4$ indicated by * is '0'; and the other in which bit $b_4$ indicated by * is '1'. Data words corresponding to channel words having the same bit pattern for bits $b_5$, $b_6$ and $b_7$ are so defined to have hamming distances of one or zero from a specified 4-bit value. This makes the inverse-conversion easy. The inverse-conversion is performed in such a way that temporary data words are produced corresponding to the four kinds of values of a sign word consisting of bits $b_7$, $b_6$ and $b_5$ as shown in FIG. 7, and bits $a_2$, $a_1$ and $a_0$ of the temporary data words are respectively inverted when $b_7$='1', $b_6$='1' and $b_5$='1' so as to thereby obtain the data words according to the conversion table in FIG. 6. Here, data word 0011 is an exception. The above conversion can be easily performed by using a ROM table. FIG. 8 shows an example of the circuit for performing the inverse-conversion.

The present invention can be effectively applied to any N/M conversion (wherein N is an integer larger than 1 and M is an integer larger than N) for converting data words each containing N data bits to channel words each containing M data bits.

FIG. 9 shows an example of 2/4 conversion table, in which each data word consists of two data bits $a_1$ and $a_0$ ($a_1$=MSB, $a_0$=LSB), and each channel word consists of four data bits bits $b_3$, $b_2$, $b_1$ and $b_0$ ($b_3$=MSB, $b_0$=LSB). In this conversion table, at least one '0' bit always exists between two '1' bits in every channel word and the LSB $b_0$ of every channel word is '0'. This means that in a channel code produced by time-serially connecting the channel words, there always exists at least one '0' bit between two '1' bits. Accordingly, the NRZI coded channel code has the feature of $T_{min}=T$.

Furthermore, since there are five kinds of channel words and four kinds of data words, data word 00, for example, may be made to correspond to two kinds of channel words in which bit $b_1$ indicated by * is respectively '0' and '1' as shown in FIG. 9, thereby enabling the control to reduce the absolute value of the DSV. Furthermore, if the channel words are outputted in the order from the LSB to produce the time-serial channel code and if bit $b_3$ of a preceeding channel word and bit $b_1$ of the following channel word are both '0', then the bit $b_0$ therebetween may be either '0' or '1'. In this case, the absolute value of the DSV can be reduced by controlling the value of bit $b_0$. An apparatus for encoding binary data according to this 2/4 conversion can be easily configured similarly to the embodiments in FIGS. 1 and 3.

Figure 10:
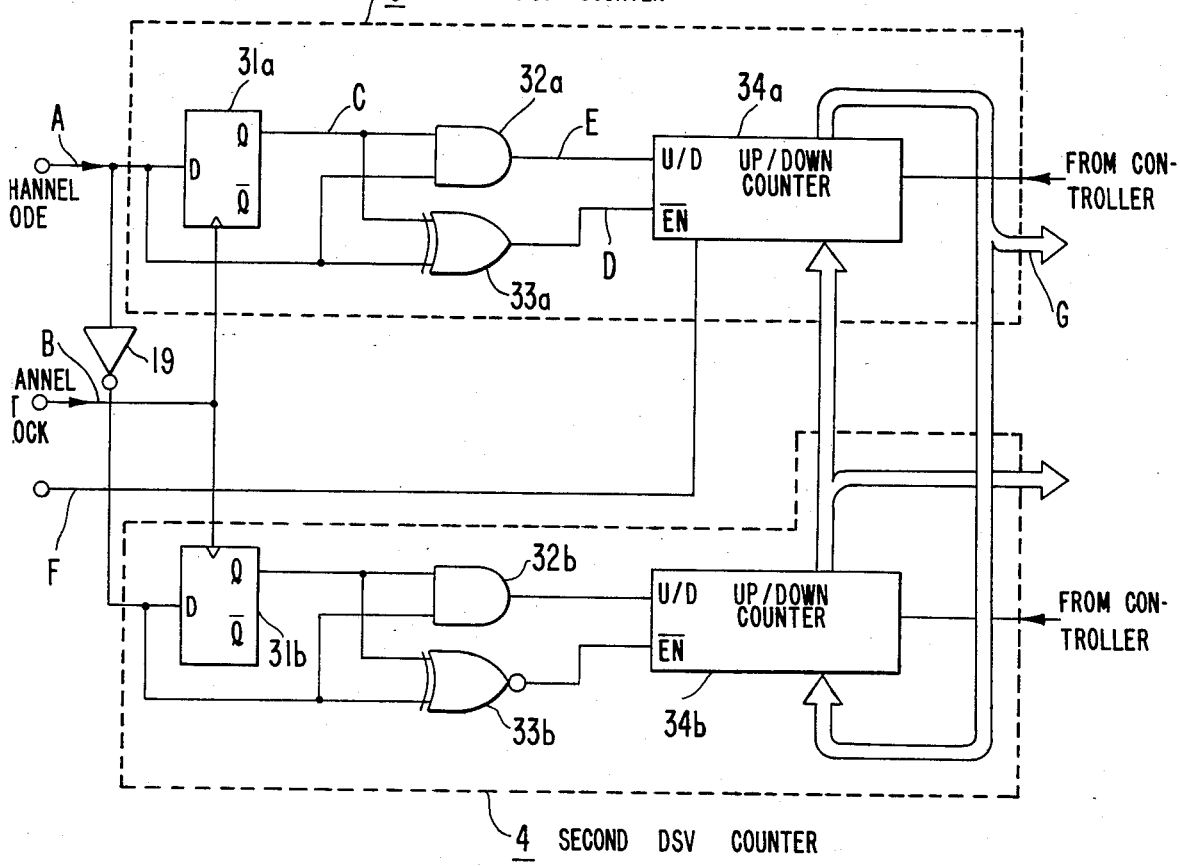
FIG. 10 is a circuit diagram showing an embodiment of first and second DSV counters used in the FIG. 1 embodiment.
Figure 11:
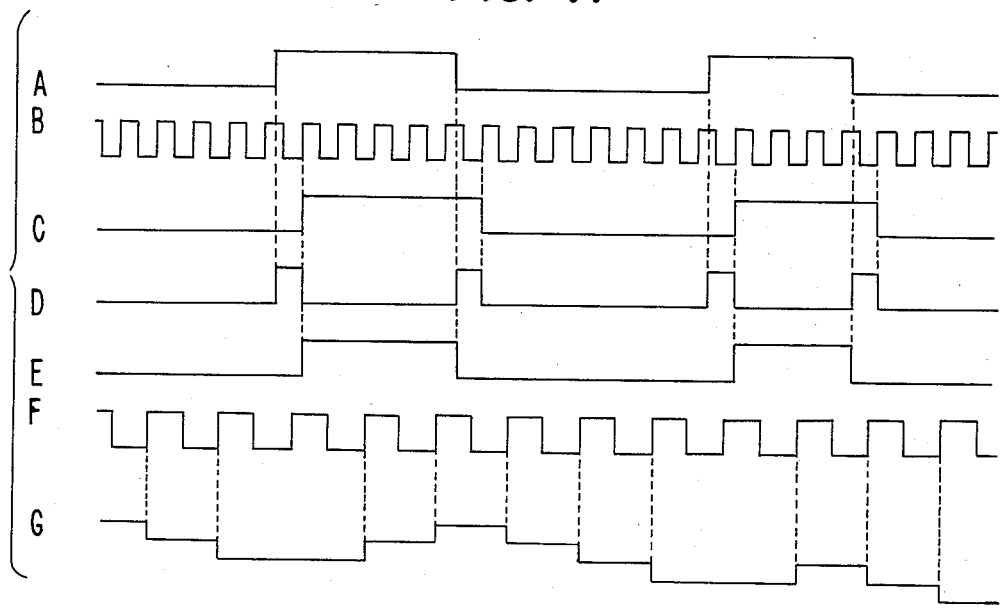
FIG. 11 is a timing chart showing the operation of the circuit in FIG. 10.

Now, the first and second DSV counters 3 and 4 will be described in more detail with reference to FIGS. 10 and 11. FIG. 10 shows an example of the circuit configurations of the first and second DSV counter 3 and 4, and FIG. 11 shows signal waveforms at portions A to G in FIG. 10. A temporary channel code A outputted from the output terminal 2b of the violation checking circuit 2 is latched by a D-flip-flop (DFF, hereafter) 31a operated by a channel bit clock B synchronized with the bit cell of the temporary channel code A. When an output C of DFF 31a has the same state as that of the input A, an output D of an EX-OR gate 33a becomes '0' so as to thereby enable an up/down counter 34a. If the states of the output C and the input A of DFF 31a are both '1', an output E of a NAND gate 32a becomes '1' so as to thereby make the up/down counter 34a operates as an up counter. Otherwise, the up/down counter 34a operates as a down counter. Under the above control, the up/down counter 34a counts a clock F which occurs with respect to every two bits of the channel code, so that a counter value G changes as shown in FIG. 11. Since the up/down counter 34a operates at every two bits of the channel code, the operating speed of the up/down counter 34a can be reduced to half the repetition frequency of the channel code. DFF 31a, NAND gate 32a, EX-OR gate 33a and up/down counter 34a constitute the first DSV counter 3. Similarly, the second DSV counter 4 is constituted by a DFF 31b, a NAND gate 32b, an EX-OR gate 33b and up/down counter 34b, and operates in a fashion similar that of the first DSV counter 3. However, the second DSV counter 4 is inputted with the channel code A through the inverter 19. Accordingly, the count value of the first DSV counter 3 is the value of the DSV when the extraordinary bit, or selectable bit, ($b_4$) of the temporary channel word is temporarily made '0', and the counter value of the second DSV counter 4 is the value of the DSV when the above extraordinary bit is temporarily made '1'. When the value of the above extraordinary bit is determined according the comparison result of the absolute values of DSV of the first and second DSV counters, the controller 6 loads the smaller of the absolute values of the DSV to the DSV counter outputting the larger of the absolute value. The second DSV counter 4 may be so configured that the up/down counter 34b is enabled when the output D of the EX-OR gate 33a is '0' and the up/down selection of the up/down counter 34b is determined by a signal obtained by inverting the output E of the NAND gate 32a. By this configuration, DFF 31b, NAND gate 32b and EX-OR gate 33b can be removed.

Figure 12:
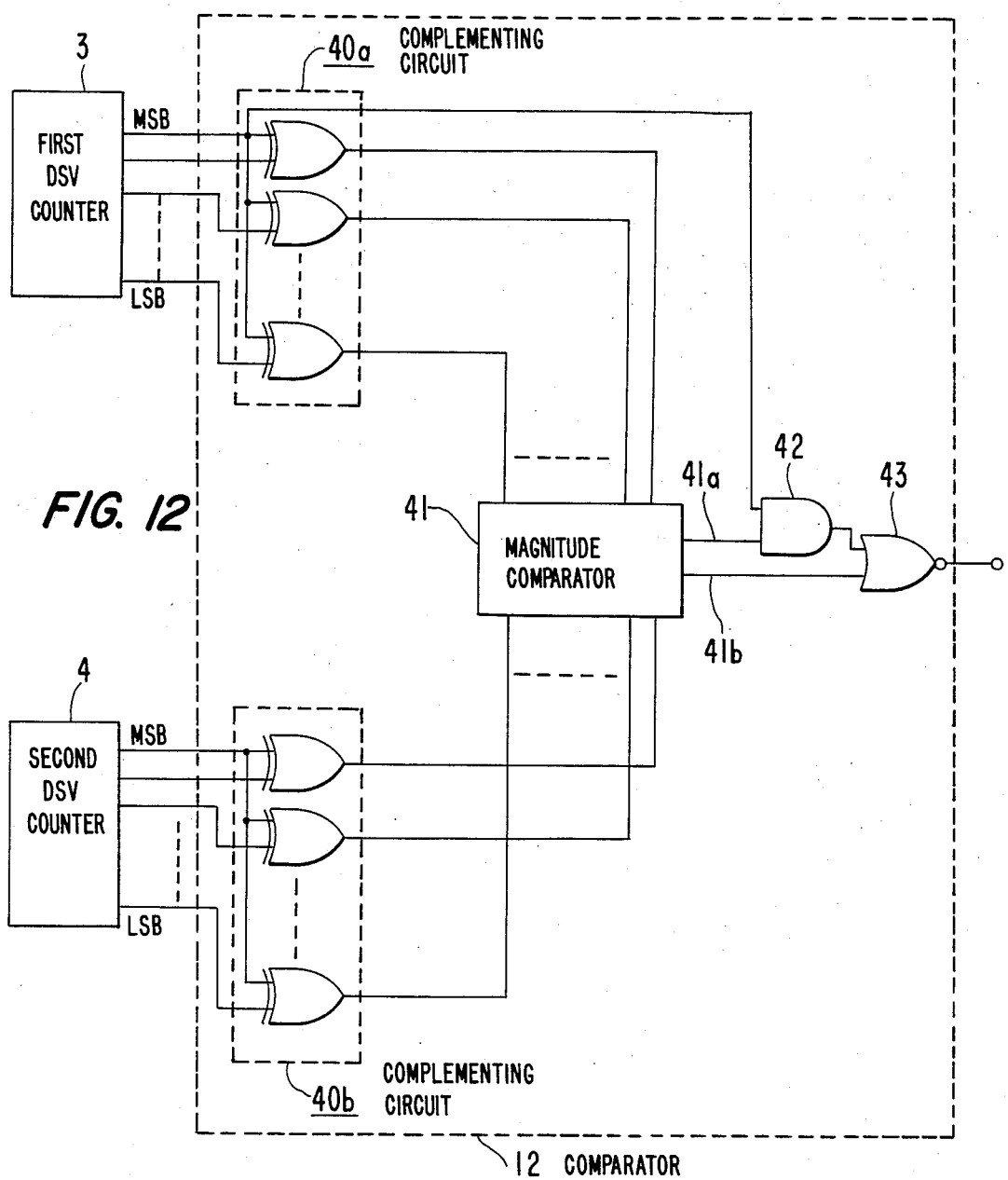
FIG. 12 is a circuit diagram showing an embodiment of a comparator used in the FIG. 1 embodiment.

The comparator 12 can be comprised by two complementing circuits 40a, 40b for respectively producing the absolute values of the DSV from the values of the DSV obtained by the first and second DSV counters 3 and 4, and a magnitude comparator 41 for comparing the absolute values of the DSV as shown in FIG. 12. Since each of the first and second DSV counters has the up/down counter, a negative value is expressed as a 2's complement. Accordingly, each complementing circuit may produce a 2's complement. However, each complementing circuit may be configured to produce a 1's complement as shown in FIG. 12. In this case, if the two inputs have the same value, the positive DSV may be selected because the absolute value of the negative DSV decreases by one when converted to its 1's complement.

The operation of the comparator 12 shown in FIG. 12 will now be described. The complementing circuit 40a produces a 1's complement of the counter value of the first DSV counter if the count value is a negative value. The complementing circuit 40b produces a 1's complement of the count value of the second DSV counter if the count value is a negative value. The magnitude comparator 41 compares the output values of the complementing circuits 40a and 40b. The magnitude comparator 41 has two output terminals 41a and 41b. If the output value of the complementing circuit 40b is larger than that of the complementing circuit 40a, only the output terminal 41b becomes '1', and if the output values of the complementing circuits 40a and 40b are equal to each other, only the output terminal 41a becomes '1'. A circuit composed of a NAND gate 42 and NOR gate 43 outputs a signal of '1' or '0' according a combination of the signals at the output terminals 41a and 41b and the sign bit (MSB) of the count value of the first DSV counter 3. The output of this circuit becomes '0' when the absolute value of the count value of the first DSV counter 3 is smaller than that of the second DSV counter 4, and otherwise becomes '1'. In other words, the output of the comparator 12 shows which of the absolute values of the DSV produced by the first and second DSV counters 3 and 4 is smaller or larger than the other.

Figure 13:
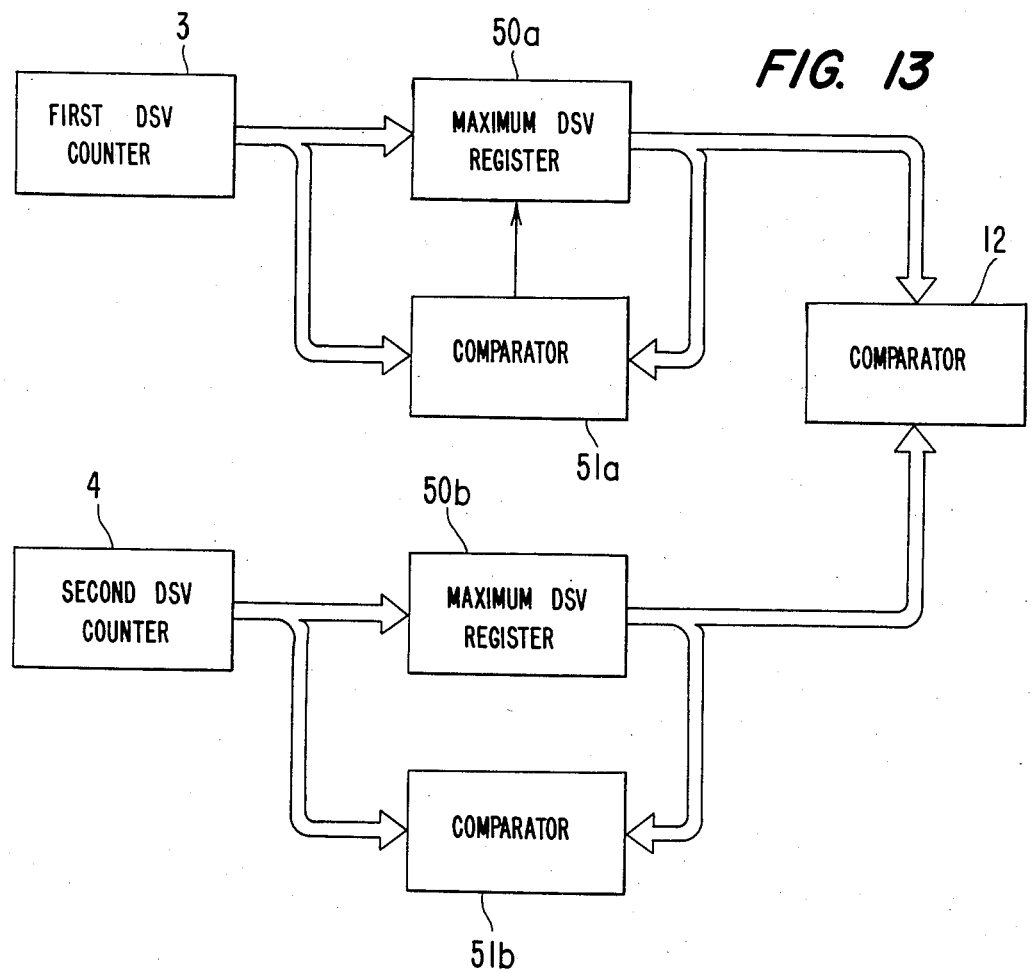

In the above described embodiments, the established value of the temporary channel word is determined so that the value of the DSV at that moment is decreased. However, the established value of the temporary channel word may be determined so that the peak value of the DSV at that moment is decreased, and an example configured in such manner is shown in FIG. 13. Referring to FIG. 13, a comparator 51a, which has the same configuration as the comparator 12, compares the absolute value of the count value of the first DSV counter 3 with the absolute value of a value stored in a maximum DSV register 50a. If the absolute value of the count value of the first DSV counter 3 is larger than the absolute value of the value stored in the maximum DSV register 50a, the comparator 51a allows the maximum DSV register 50a replace the stored value by the count value of the first DSV counter 3 at that moment. Accordingly, the value stored in the maximum DSV register 50a is the maximum absolute value of the DSV at that moment. A maximum DSV register 50b and a comparator 51b operate in the same way to store the maximum value of DSV of the second DSV counter 4 in the maximum DSV register 50b. The comparator 12 compares the absolute value of the values stored in the maximum DSV registers 50a and 50b. According to this comparison result, the controller 6 controls so as to establish the value for the temporary channel word, or so as to convert the data word which remains unconverted to an established channel word. This method is effective to further improve the DC component suppressing ability.

As described in the foregoing description, DC component can be suppressed by using the extraordinary data words. However, if the ordinary data words continuously appear for a long time, the above described control will not occur which means that the DC component cannot be suppressed. This problem can be solved by inserting an extraordinary data word periodically into the data word train. This method can be realized by, for example, a circuit as shown in FIG. 14.

Figure 14:
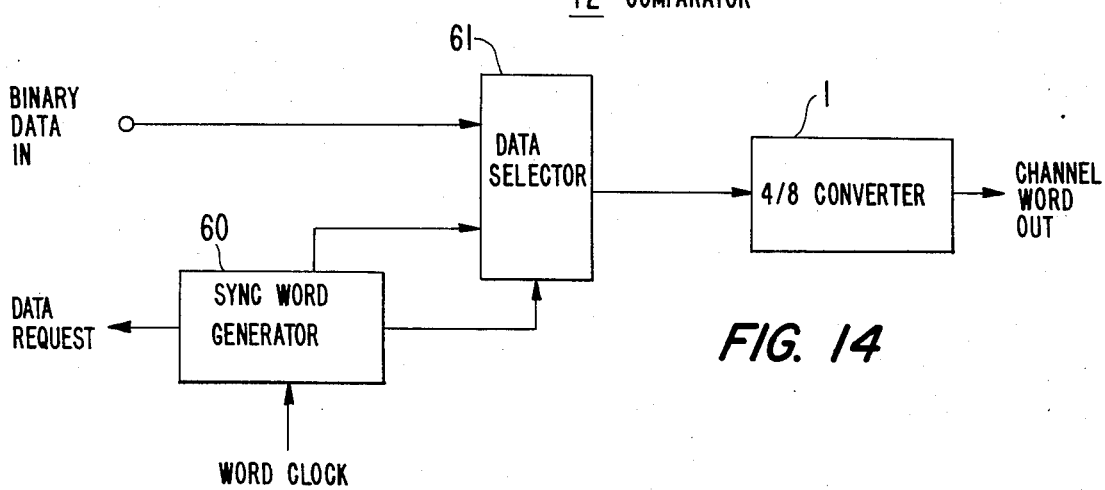
FIGS. 13-15 are block diagrams showing other embodiments of converting means used in the FIG. 1 or FIG. 3 embodiment.

Referring to FIG. 14, a SYNC word generator 60, synchronized with the word clock from the timing generator 16, outputs a data request. An external device (not shown) outputs a binary data word in response to the data request. The binary data word is supplied to a data selector 61 which usually transfers the binary data word to the 4/8 converter 1. The SYNC word generator, when received a predetermined number of word clocks, outputs a specific SYNC word and controls the data selector 61 to transfer this SYNC word to the 4/8 converter 1. After that, the SYNC word generator restarts counting the number of word clocks from 0. By repeating the above operation, the data inputted to the 4/8 converter 1 periodically includes SYNC words. The SYNC word is selected to be an extraordinary data word. Accordingly, the above described control to reduce DSV can be periodically done to assure the DC free feature.

Figure 15:
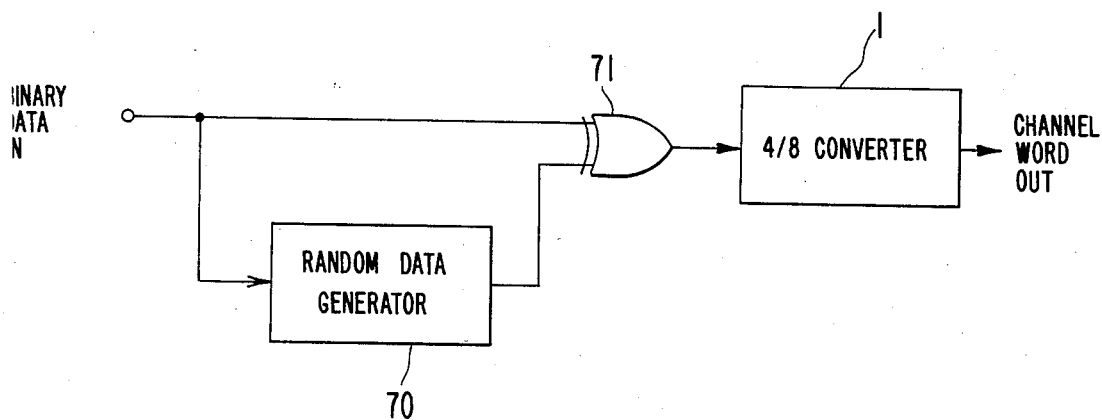

This effect can be obtained also by a circuit configuration as shown in FIG. 15. Referring to FIG. 15, SYNC marks are contained periodically in the input binary data. A random data generator 70 synchronized with the SYNC marks generates a periodically circulating random data sequence. The input binary data are scrambled with the random data sequence by an EX-OR gate 71. The scrambled binary data will later be scrambled with the same random data sequence by an EX-OR gate to be recovered as the original binary data. The random data generator may be realized by, for example, configuring a feedback loop comprised by shift registers and EX-OR gates to obtain a maximum length sequence.

FIG. 16 shows an example of the violation checking circuit 2. Each channel word outputted from the 4/8 converter 1 is transferred through latches 80 and 81 to a shift register 82 in synchronism with the word clock. The extraordinary flag is transferred through D-flip-flops 88 and 89 to a D-flip-flop 90. However, if a channel word containing the extraordinary bit is latched by the latch 81 and more than eleven continuous '0' bits are detected by a Tmax checking circuit 87, the transfer of the extraordinary flag corresponding to the channel word is inhibited. In this case, the extraordinary bit is made '1' by means of an OR gate 91 when the channel word is loaded to the shift register 82. A Tmin checking circuit 83 tests bit $b_1$ of the channel word latched by the latch 80 and bit $b_7$ of the channel word latched by the latch 81, and, when these bits are both '1', makes these bits '0' by means of AND gates 85 and 86 and also makes '1' bit $b_0$ of the channel word latched by the latch 80 by means of an OR gate 84. If bit $b_0$ of the channel word loaded to the shift register 82 is selectable to be '0' or '1' so as to control DSV as described before, a merging bit checking circuit 93 output a signal '1' which is then latched by a D-flip-flop 95. A data selector 94 selects the output signal of the D-flip-flop 95 when data bits $b_0$, $b_1$, $b_2$ and $b_3$ are outputted in serial from the shift register 82, and selects the output signal of the D-flip-flop 90 when data bits $b_4$, $b_5$, $b_6$ and $b_7$ are outputted in serial from the shift register 82. The signal selected by the data selector 94 is the arbitrary flag 2c.

What is claimed is:

1. An apparatus for encoding binary data comprising: a converting means for converting binary data words each containing N data bits (wherein N is an integer larger than (1) to binary channel words each containing M data bits (wherein M is an integer larger than N); and an NRZI modulating means for modulating said channel words into NRZI coded channel codes, wherein said converting means holds a specific data word which satisfies at least one of a condition that the specific data word has a specific bit pattern and a condition that the specific data word has a specific relationship to adjacent data words; converts said held specific data word to an established channel word so that absolute value of digital sum variation of previously encoded binary data is reduced when another specific data word which satisfies at least one of said conditions has been inputted; and outputs said established channel word after at least a delay time required to convert said held specific data word to said established channel word, and wherein, if a predetermined number of data words which are convertible to channel words in real time have been inputted before said another specific data word is inputted, said converting means converts said held specific data to said established channel word so that absolute value of digital sum variation of previously encoded binary data is reduced when said predetermined number of data words have been inputted.

2. An apparatus according to claim 1, wherein said specific data word corresponds to two channel words which differ from each other only in a specified data bit, and said established channel word is one of said two channel words.

3. An apparatus according to claim 1, wherein said converting means has means for generating random data which circulates in synchronism with input data words, and a means for scrambling said random data with said input data words such that output data of said scrambling means are converted to said channel words.

4. An apparatus according to claim 1, wherein said converting means performs conversion according to the following rules:
  (i) two or more '0' bits exist between two '1' bits in said channel word if said channel word contain two or more '1' bits;
  (ii) a most significant bit or least significant bit of each channel word is made normally '0' as a merging bit, and when bits adjacent to said merging bit at both sides thereof are both '1', said adjacent bits are both made '0' and said merging bit is made '1'; and
  (iii) said merging bit is made '0' or '1' so that the absolute value of DSV is reduced when a which is three bits before said merging bits is '1' and said merging bit is followed by two continuous '0' bits or when two continuous bits just before said merging bit are both '0' and a bit three bits after said merging bit is '1'.

5. An apparatus according claim 1, wherein said conversion means performs conversion according to the following rules:
  (i) two or more '0' bits exist between two '1' bits in said channel word if said channel word contains two or more '1' bits;

(ii) a most significant bit or least significant bit of each channel word is made normally '0' as a merging bit, and when bits adjacent to said merging bit at both sides thereof are both '1', said adjacent bits are both made '0' and said merging bit is made '1';

(iii) said merging bit is made '0' or '1' so that the absolute value of DSV is reduced when a bit which is three bits before said merging bit is '1' and two bits following said merging bit are both '0' or when two bits just before said merging bit are both '0' and a bit three bits after said merging bit is '1'; and (iv) said specific data word is converted to one of two channel words which differ from each other only in one specific data bit so that the absolute value of DSV is reduced.

6. An apparatus according to claim 1, wherein said converting means comprises: a converter for converting said data words to said channel words; a channel word storage memory for storing said channel words; a pointer register for storing an address in which a temporary channel word corresponding to said specific data word is stored in said memory; and a means for writing said established channel word into said address stored in said pointer register in place of said temporary channel word when said established channel word is determined.

7. An apparatus according to claim 1, wherein said converting means comprises: a data word storage memory for storing said data words and their attributes; a means for converting said data words stored in said memory to said channel words with reference to said attributes; a pointer register for storing an address in which said specific data word and its attribute are stored in said memory; and a means for changing said attribute of said specific data word stored in said address stored in said pointer register so that said specific data word can be converted to said established channel word.

8. A method for encoding binary data into NRZI codes comprising the steps of:

converting binary data words each containing N data bits (wherein N is an integer larger than 1) into binary channel words each containing M data bits (wherein M is an integer larger than N); and NRZI modulating said channel words into NRZI coded channel codes, wherein said converting step comprises the steps of:

holding a specific data word which satisfies at least one of a condition that the specific data word has a specific bit pattern and a condition that the specific data word has a specific relationship to adjacent data words;

converting said held specific data word to an established channel word so that absolute value of digital sum variation of previously encoded binary data is reduced when another specific data word which satisfies at least one of said conditions has been inputted; and outputting said established channel word after at least a delay time required to convert said held specific data word to said established channel word, and wherein, if a predetermined number of data words which are convertible to channel words in real time have been inputted before said another specific data word is inputted, said step of converting said held specific data converts said held specific data to said established channel word so that absolute value of digital sum variation of previously encoded binary data is reduced when said predetermined number of data words have been inputted.

9. A method according to claim 8, wherein said specific data word corresponds to two channel words which differ from each other only in a specified data bit, and said established channel word is one of said two channel words.

10. A method according to claim 8, wherein said step for converting said data words to said channel words is performed according to the following rules:

(i) two or more '0' bits exist between two '1' bits in said channel word if said channel word contain two or more '1' bits;

(ii) a most significant bit or least significant bit of each channel word is made normally '0' as a merging bit, and when bits adajcent to said merging bit at both sides thereof are both '1', said adjacent bits are both made '0' and said merging bit is made '1'; and (iii) said merging bit is made '0' or '1' so that the absolute of DSV is reduced when a bit which is three bits before said merging bit is '1' and said merging bit is followed by two continuous '0' bits or when two continuous bits just before said merging bit are both '0' and a bit three bits after said merging bit is '1'.

11. A method according to claim 8, wherein said step for converting said data words to said channel words is performed according to the following rules:

(i) two or more '0' bits exist between two '1' bits in said channel word if said channel word contains two or more '1' bits;

(ii) a most significant bit or least significant bit of each channel word is made normally '0' as a merging bit, and when bits adjacent to said merging bit at both sides thereof are both '1', said adjacent bits are both made '0' and said merging bit is made '1';

(iii) said merging bit is made '0' or '1' so that the absolute value of DSV is reduced when a bit which is three bits before said merging bit is '1' and two bits following said merging bit are both '0' and a bit three bits after said merging bit is '1'; and (iv) said specific data word is converted to one of two channel words which differ from each other only in one specific data bit so that the absolute value of DSV is reduced.

* * * * *